(12) United States Patent
Nakamura

(10) Patent No.: US 8,558,452 B2
(45) Date of Patent: Oct. 15, 2013

(54) ORGANIC ELECTROLUMINESCENT DEVICE

(75) Inventor: Akifumi Nakamura, Kanagawa (JP)

(73) Assignee: Sony Corporation, Tokto (JP)

(*) Notice: Subject to any disclaimer, the term of this patent is extended or adjusted under 35 U.S.C. 154(b) by 1057 days.

(21) Appl. No.: 11/671,586

(22) Filed: Feb. 6, 2007

(65) Prior Publication Data
US 2007/0182320 A1 Aug. 9, 2007

(30) Foreign Application Priority Data
Feb. 8, 2006 (JP) ................ P2006-030576

(51) Int. Cl.
H01J 1/62 (2006.01)
H01J 63/04 (2006.01)

(52) U.S. Cl.
USPC ........................... 313/506; 313/504

(58) Field of Classification Search
USPC ................................. 313/498–512
See application file for complete search history.

(56) References Cited

U.S. PATENT DOCUMENTS

2003/0214230 A1* 11/2003 Wood et al. .................. 313/506
2004/0202893 A1* 10/2004 Abe .............................. 428/690

FOREIGN PATENT DOCUMENTS

| JP | 2004-296410 | 10/2004 |
| JP | 2005-032618 | 2/2005 |
| JP | 2005-166637 | 6/2005 |

OTHER PUBLICATIONS

Applied Physics Letters vol. 72, No. 17 "A metal-free cathode for organic semiconductor devices" by Parthasarathy et al. published Feb. 27, 1998.*
Japanese Office Action issued on Feb. 3, 2010 in connection with counterpart JP Application No. 2006-030576.

* cited by examiner

Primary Examiner — Anh Mai
Assistant Examiner — Zachary J Snyder
(74) Attorney, Agent, or Firm — Dentons US LLP (57) ABSTRACT

An organic electroluminescent device provided with a lower electrode formed on a substrate, a light emitting unit having at least an organic light emitting layer and formed on the lower electrode, and a light transmissive upper electrode formed on the light emitting unit, wherein a connection layer for supplying a charge into the light emitting unit and a charge transport layer having charge transporting properties of a reverse conducting type against a charge to be injected from the upper electrode are stacked in this order from a side of the light emitting unit between the light emitting unit and the upper electrode.

6 Claims, 8 Drawing Sheets

ORGANIC ELECTROLUMINESCENT DEVICE

CROSS REFERENCES TO RELATED APPLICATIONS

The present invention contains subjects related to Japanese Patent Application JP 2006-030576 filed in the Japan Patent Office on Feb. 8, 2006, the entire contents of which being incorporated herein by reference.

BACKGROUND OF THE INVENTION

1. Field of the Invention

The invention relates to an organic electroluminescent device. In particular, the invention relates to an organic electroluminescent device which is suitable for a so-called top emission type for extracting emitted light from a side opposite to a substrate on which the device is formed.

2. Description of the Related Art

An organic electroluminescent device (so-called organic EL device) is a device of a self-luminous type having a light emitting layer made of an organic compound between an anode and a cathode and is watched as a device capable of realizing a large-area display device of low-voltage driving. In a display device using such an organic electroluminescent device, by fabricating a circuit provided with a thin film transistor (TFT) for driving the organic electroluminescent device into an active matrix type formed on the same substrate as the device, it is possible to devise to achieve high functionalization of the device. In the active matrix type, since a necessary current can be injected and kept for every pixel, there is theoretically no limitation in a screen size. Thus, the active matrix type is expected to be applied to display devices of 5 inches or larger, too.

In manufacturing a display device of an active matrix type, an organic electroluminescent device is formed on a substrate on which a thin film transistor has been previously formed (so-called TFT substrate) in a state that it is connected to the subject thin film transistor. For that reason, what the organic electroluminescent device is made of a so-called top emission type for extracting emitted light from a side of an upper electrode as an opposite side to the substrate is effective in ensuring an aperture ratio of pixel.

In the organic electroluminescent device of a top emission type, by configuring an upper electrode formed so as to have a reverse polarity against a lower electrode which becomes an anode or a cathode, emitted light generated within the device is extracted from a side of the upper electrode.

Here, an indium-tin-oxide (ITO) film which is usually used as a transparent conductive film has a high work function as approximately 5 eV so that while the ITO film is suited for an anode for which a material with high work function is suitable, it is not suitable for a cathode using a material with low work function.

For that reason, with respect to the configuration in which the upper electrode is a cathode (namely, a transparent cathode), there is proposed a configuration in which an electron injection layer made of a mixture of a metal with low work function such as cesium (Cs) and an electron transporting organic material is stacked between an organic light emitting layer and an upper electrode made of a transparent conductive film, thereby enhancing electron injection properties. However, a number of transparent conductive films represented by the foregoing ITO are made of a metal oxide and formed by a sputtering method using, as a process gas, argon (Ar) or oxygen ($O_2$). For that reason, at the time of film formation of a transparent conductive film, there was involved such a problem that the metal-containing electron injection layer as a base is decomposed and oxidized to cause a lowering of electron injection properties, an increase of driving voltage, the generation of current leakage, a lowering of life, and so on.

In order to prevent this problem from occurring, there is proposed a configuration in which a metal layer made of an alkali metal or an alkaline earth metal and a layer made of a mixture of such a metal and an electron transporting organic material are stacked in this order between the organic light emitting layer and the upper electrode made of a transparent conductive film. According to such a configuration, it is described that a phenomenon in which the metal layer is oxidized at the time of film formation by sputtering of a transparent conductive film, whereby the device is deteriorated is prevented from occurring; and that the metal layer keeps high injection efficiency, whereby luminous efficiency is improved (see JP-A-2004-296410 (especially, see FIG. 1 and paragraph [0009]) (Patent Document 1)).

On the other hand, even in the case where the upper electrode is an anode, the base layer (hole injection layer) is damaged at the time of film formation by sputtering of a transparent conductive film, whereby hole injection properties are lowered. Then, there is proposed a configuration using, as a hole injection layer, a material containing an inorganic material and having electron accepting properties, for example, $V_2O_5$. According to such a configuration, it is described that the damage of the hole injection layer at the time of film formation by sputtering of a transparent conductive film which becomes the upper electrode is suppressed, whereby high hole injection efficiency can be realized (see JP-A-2005-32618 (especially, see FIG. 1 and paragraphs [0044] to [0045]) (Patent Document 2)).

SUMMARY OF THE INVENTION

However, even in any of organic electroluminescent devices of the foregoing configurations, in order to realize a display device using such an organic electroluminescent device, it is hardly said that initial characteristics and life characteristics of driving voltage and luminance are sufficient, and further improvements of the characteristics are demanded.

Then, it is desirable to provide an organic electroluminescent device of a top emission configuration provided with a light transmissive upper electrode capable of devising to further improve initial characteristics and life characteristics of driving voltage and luminance.

According to an embodiment of the invention, there is provided an organic electroluminescent device of a so-called top emission type, which is provided with a lower electrode formed on a substrate; a light emitting unit having at least an organic light emitting layer and formed on the lower electrode; and a light transmissive upper electrode formed on the light emitting unit. In particular, a connection layer and a charge transport layer are stacked in this order from a side of the light emitting unit between the light emitting unit and the upper electrode. Of these, the connection layer is a layer for supplying a charge into the light emitting unit. Also, the charge transport layer is a layer having charge transporting properties of a reverse conducting type against a charge to be injected from the upper electrode. For example, when the lower electrode is an anode and the upper electrode is a cathode, this charge transport layer is a hole transport layer.

In the organic electroluminescent device of such a configuration, the connection layer and the charge transport layer which are interposed between the light emitting unit and the upper electrode become a barrier in forming the upper electrode to prevent the light emitting unit from damaging, thereby keeping film quality and performance of the light emitting unit. As will be explained in the Examples described later, it has been confirmed that as compared with a configuration in which a connection layer and a charge transport layer are not provided and a configuration in which only a connection layer is provided, according to the configuration of this embodiment of the invention, not only deterioration with time of luminance of and increase of driving voltage of the device are suppressed, but also initial luminance is high and driving voltage is controlled to a low level. Furthermore, according to the thus configured organic electroluminescent device, it has also been noted that a good device performance is kept without causing a lowering of the device performance due to the provision of the connection layer and the charge transport layer which become a barrier against the light emitting unit in forming the upper electrode.

In the light of the above, according to the organic electroluminescent device of the embodiment of the invention, change of properties of the light emitting unit due to the formation of the upper electrode can be prevented from occurring. As a result, even when a transparent conductive material to be formed by a sputtering method by which a base layer is largely influenced is used as the upper electrode, it is possible to keep the device performance good; and it is possible to devise to improve initial characteristics and long life characteristics of an organic electroluminescent device of a top emission type.

DETAILED DESCRIPTION OF THE PREFERRED EMBODIMENTS

Figure 1:
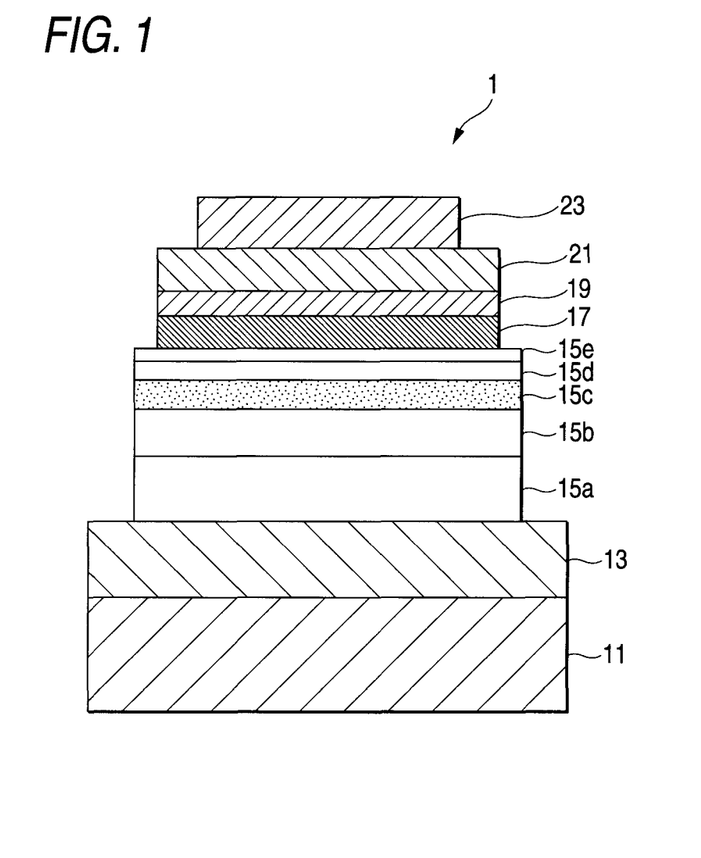
FIG. 1 is a sectional view to show a configuration of an organic electroluminescent device according to an embodiment of the invention.

A configuration of an organic electroluminescent device according to an embodiment of the invention and a configuration of a display device using the same are hereunder described in detail with reference to the accompanying drawings. FIG. 1 is a sectional view to schematically show an organic electroluminescent device according to an embodiment of the invention.

An organic electroluminescent device 1 as illustrated in FIG. 1 is provided in an upper part of a substrate 11. That is, the organic electroluminescent device 1 is made of a stack of a lower electrode 13, a light emitting unit 15, a connection layer 17, a hole injection layer 19, a hole transport layer 21 and an upper electrode 23 in this order on the substrate 11 and configured so as to extract light emission from a side of the upper electrode 23. Of these, the light emitting unit 15 may be a usually configured light emitting unit having at least an organic light emitting layer 15c. The embodiment of the invention is characterized in that the connection layer 17, the hole injection layer 19 and the hole transport layer 21 are interposed between this light emitting unit 15 and the upper electrode 23.

A detailed configuration of each of the parts in this organic electroluminescent device 1 is hereunder described in the order from a side of the substrate 11.

First of all, the substrate 11 is properly selected and used among a transparent substrate such as glass, a silicon substrate, and a s film-like flexible substrate. When the driving system of a display device configured by using this organic electroluminescent device 1 is an active matrix system, a TFT substrate provided with TFT for every pixel is used as the substrate 11. In that case, it is advantageous in view of an aperture ratio of the pixel to use the organic electroluminescent device 1 of a top emission type for extracting light emission only from a side opposite to the substrate 11. Also, in that case, the respective organic electroluminescent device 1 is of a structure in which the device is driven by using TFT. Incidentally, when this organic electroluminescent device 1 is a double-sided light emission type for extracting emitted light from the side of the substrate 11, too, this substrate 11 is configured of a light transmissive material.

In the present embodiment, an anode is used as the lower electrode 13 formed on this substrate 11. Examples of the lower electrode (anode) 13 include transparent conductive films made of a metal such as gold (Au), silver (Ag), copper (Cu), chromium (Cr), nickel (Ni), aluminum (Al) and a magnesium-silver (MgAg) alloy, ITO (In—Sn—O), IZO (In—Zn—O), zinc oxide (ZnO), or the like; and organic conductive films made of PEDOT/PSS [poly(3,4-ethylenedioxythiophene)/poly(4-styrene sulfonate)] or the like. Above all, it is suitable to use a material having a high work function as far as possible because the hole injection barrier into the organic layer can be reduced. The lower electrode (anode) 13 made of such a material may be of a single-layer structure or a stack structure using the foregoing material.

As described previously, the light emitting unit 15 to be provided on this lower electrode 13 may be a usually configured light emitting unit containing at least the organic light emitting layer 15c and is, for example, made of a stack of a hole injection layer 15a, a hole transport layer 15b, an organic light emitting layer 15c, an electron transport layer 15d and an electron injection layer 15e in this order from the lower layer.

Of these, the hole injection layer 15a is made of, for example, copper phthalocyanine (CuPc), 4,4',4"-tris(naphthylphenylamino)triphenylamine (TNATA), 4,4',4"-tris[N-(3-methylphenyl)-N-phenylamino]triphenylamine (m-MTDATA), or the like.

Examples of a material which configures the hole transport layer 15b include N,N'-bis(1-naphthyl)-N,N'-di-phenyl-1,1'-biphenyl-4,4'-diamine (NPD), N,N'-diphenyl-N,N'-bis(3-methylphenyl)-1,1'-diphenyl-4,4'-diamine (TPD), and N,N'-diphenyl-N,N'-bis[N-phenyl-N-(2-naphthyl)-4'-aminobiphenyl-4-yl]-1,1'-biphenyl-4,4'-diamine (NPTE). Incidentally, the foregoing hole injection layer 15a may also work as the hole transport layer 15b.

The organic light emitting layer 15c can be selected depending upon a desired color. In a blue system, examples of the organic light emitting layer 15c include layers made of an oxadiazole derivative, a cyclopentadiene derivative, a pyrazoloquinoline derivative, a distyrylarylene derivative, an oligothiophene derivative, or the like. In a green system, examples of the organic light emitting layer 15c include layers obtained by doping the light emitting layer of a blue system with a known green dye such as coumarin derivatives, for example, Coumarin 6 and quinacridone derivatives. In a red system, examples of the organic light emitting layer 15c include layers obtained by doping the light emitting layer of a blue system or a green system with a known red dye such as pyran derivatives, for example, Phenyl Red, DCM1 (4-dicyanmethylene-2-methyl-6-(p-dimethylaminostyryl)-4H-pyran), and DCJT (4-(dicyanomethylene)-2-t-butyl-6-(julolidylsty-ryl)-pyran), squarilium derivatives, porphyrin derivatives, chlorin derivatives, and julolidine derivatives.

Examples of the electron transport layer 15d include layers made of, for example, an alumiquinolinol complex ($Alq_3$), an oxadiazole derivative (for example, OXD and PBD), a triazole derivative (for example, TAZ), a phen-anthroline derivative (for example, bathocuproin and bathophenanthroline), or the like.

Examples of the electron injection layer 15e include thin layers made of an alkali metal or an alkaline earth metal (for example, lithium, cesium, calcium, and magnesium); layers made of an alkali metal or alkaline earth metal compound (for example, lithium fluoride, cesium fluoride, calcium fluoride, magnesium fluoride, lithium oxide, cesium oxide, calcium fluoride, and magnesium fluoride); and layers obtained by doping the material configuring the foregoing electron transport layer 15c with the foregoing material.

In the light emitting unit 15 having the foregoing stack configuration, the layers other than the organic light emitting layer 15c may be provided as the need arises. For example, the hole injection layer 15a and the hole transport layer 15d shown within the parentheses in FIG. 1 can be omitted. Furthermore, each of the layers may be of a stack structure made of plural layers. For example, the organic light emitting layer 15c may be a white light emitting layer made of a stack of a red light emitting layer, a green light emitting layer and a blue light emitting layer. Moreover, a tandem structure in which plural light emitting units 15 are stacked via a connection layer may be employed.

The connection layer 17 which is provided on the thus configured light emitting unit 15 is provided as a so-called charge generation layer and is made of a material capable of generating an electron-hole pair within a thin film. The connecting layer 17 is configured such that a charge (electron) generated within the connection layer 17 is injected into a side of the light emitting unit 15 and that a charge (hole) generated within the connection layer 17 is injected into a side of the hole injection layer 19.

This connection layer 17 is made of, for example, an electron accepting material or configured as a mixed film of an electron accepting material and an electron donating material. Examples of the electron accepting material which can be used include vanadium oxide, molybdenum oxide, tungsten oxide, ruthenium oxide, ferric chloride DDQ (dicyanodichloroquinone), TNF (trinitrofluorenone), and TCNQ (tetracyanoquinodimethane). Examples of the electron donating material which can be used include the foregoing materials which configure the hole injection layer 15a and the foregoing materials which configure the hole transport layer 15b. The connection layer 17 made of such a material may be of a single-layer structure or a stack structure using the foregoing material.

The hole injection layer (charge injection layer) 19 provided on this connection layer 17 is configured by using a material properly selected among materials the same as those enumerated for the hole injection layer 15a which configures the light emitting unit 15. However, the hole injection layer 19 and the hole injection layer 15a may be configured of the same material or a different material. The hole injection layer 19 may be of a single-layer structure or a stack structure using the foregoing material. Incidentally, this hole injection layer 19 may be provided as the need arises and can be omitted.

The hole transport layer (charge transport layer) 21 provided on this hole injection layer 19 is configured by using a material properly selected among materials the same as those enumerated for the hole transport layer 15b which configures the light emitting unit 15. However, the hole transport layer 21 and the hole transport layer 15b may be configured of the same material or a different material. The hole transport layer 21 may be of a single-layer structure or a stack structure using the foregoing material.

The upper electrode 23 on the hole transport layer 21 is configured of a light transmissive material and is used as a cathode in the present embodiment. Examples of the upper electrode (cathode) 23 include transparent conductive films made of a metal such as gold (Au), silver (Ag), copper (Cu), chromium (Cr), nickel (Ni), aluminum (Al) and a magnesium-silver (MgAg) alloy, ITO (In—Sn—O), IZO (In—Zn—O), zinc oxide (ZnO), or the like; and organic conductive films made of PEDOT/PSS [poly(3,4-ethylenedioxythiophene)/poly(4-styrene sulfonate)] or the like. By using a transparent conductive film with good light transmissibility, it is possible to devise to increase the amount of extraction of emitted light and to improve the luminance.

For example, when the organic electroluminescent device 1 has a cavity structure, the upper electrode (cathode) 23 may be configured so as to have semi-transmissive and semi-reflecting properties, and one side of the cavity structure may be formed as a reflection surface. In that case, a metal thin layer having a thickness in such a degree that both light reflection properties and light transmissibility are obtainable is used as the upper electrode (cathode) 23. A double layer structure in which a transparent conductive film capable of complementing conductivity is stacked on this metal thin film may be employed.

The organic electroluminescent device 1 having the foregoing configuration is a top emission type in which emitted light generated in the organic light emitting layer 15c in the light emitting unit 15 is extracted from the light transmissive upper electrode (cathode) 23. Incidentally, the display device using the thus configured organic electroluminescent device 1 is configured such that plural organic electroluminescent devices 1 are arrayed and formed for every pixel on the same substrate 11.

The thus configured organic electroluminescent device 1 is configured such that the upper electrode 23 is provided in an upper part of the light emitting unit 15 via the connection layer 17, the hole injection layer 19 and the hole transport layer 21. According to this configuration, in forming the upper electrode 23, these layers 17 to 21 become a barrier to prevent the light emitting unit 15 from damaging, thereby keeping film quality and performance of the light emitting unit 15. For that reason, concretely, for example, even when a transparent conductive material to be formed by a sputtering method by which a base layer is largely influenced is used as the upper electrode 23 and the uppermost surface of the light emitting unit 15 is configured of the electron injection layer 15e made of an alkali metal or an alkaline earth metal, it is possible to prevent this electron injection layer 15e from oxidation.

As will be explained in the Examples described later, it has been confirmed that as compared with a configuration in which these layers 17 to 21 are not provided and a configuration in which only the connection layer 17 is provided, in the organic electroluminescent device 1 having a configuration in which the connection layer 17, the hole injection layer 19 and the hole transport layer 21 are provided, not only deterioration with time of luminance of and increase of driving voltage of the device are suppressed, but also initial luminance is high and driving voltage is controlled to a low level. Furthermore, according to the thus configured organic electroluminescent device 1, it has also been noted that a good device performance is kept without causing a lowering of the device performance due to the provision of the layers 17 to 21 which become a barrier against the light emitting unit 15 in forming the upper electrode 23.

As a result, even when a transparent conductive material to be formed by a sputtering method by which a base layer is largely influenced is used as the upper electrode 23, it is possible to keep the device performance good; and it is possible to devise to improve initial characteristics and life characteristics of the organic electroluminescent device 1 of a top emission type.

Incidentally, in the foregoing embodiment, the organic electroluminescent device 1 in which the embodiment according to the invention is applied to the configuration in which the lower electrode 13 is an anode and the upper electrode 23 is a cathode is applied has been described. However, the embodiment according to the invention is also applicable to an organic electroluminescent device in which the lower electrode is a cathode and the upper electrode is an anode, and the same effects can be obtained. In that case, the light emitting unit 15 having the foregoing configuration is stacked in a reverse order in an upper part of the lower electrode (cathode). The organic electroluminescent device is configured such that a connection layer the same as that described in the foregoing embodiment is provided on this reversely stacked light emitting unit; an electron injection layer is provided as a charge injection layer in an upper part of the connection layer; an electron transport layer is further provided as a charge transport layer; and an upper electrode (anode) is provided on this electron transport layer.

EXAMPLES

Next, manufacturing procedures of each of organic electroluminescent devices of concrete Example according to an embodiment of the invention and Comparative Examples 1 and 2 against this Example are described.

Figure 2:
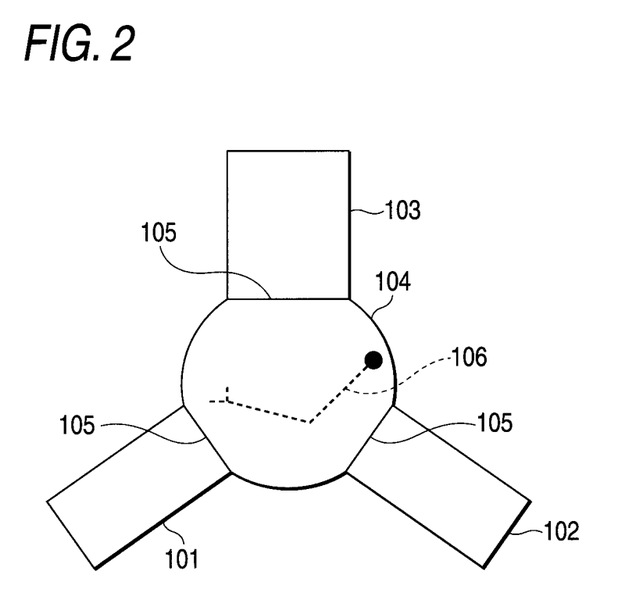
FIG. 2 is a view showing a configuration example of a vacuum device which is used for the preparation of an organic electroluminescent device.

Incidentally, a vacuum device as illustrated in FIG. 2 was used in the preparation of each of organic electroluminescent devices of the Example and Comparative Examples. A vacuum device 100 as illustrate in FIG. 2 is provided with a vapor deposition compartment 101, a sputtering compartment 102, a glove box compartment 103, and a carrier compartment 104 connected to each of them. A door 105 is provided between the carrier compartment 104 and each of the compartments 101 to 103 for the purpose of isolating a gas atmosphere in the inside thereof. A robot arm 106 is set up within the carrier 104 for the purpose of carrying a treating substrate into each of the compartments 101 to 103 via the carrier compartment 104. Thus, in the vacuum device 100, the treatment can be continuously carried out within each of the compartments 101 to 103 without releasing the treating substrate into the air.

At the time of film formation in each of the compartments 101 to 103, the robot arm 106 is contained in the carrier compartment 104, and the door 105 between each of the compartments 101 to 103 and the carrier compartment 104 is closed, whereby the inside of each of the compartments 101 to 103 is kept in a film formation atmosphere. Incidentally, the ultimate vacuum of each of the vapor deposition compartment 101, the sputtering compartment 102 and the glove box compartment 103 is kept at a vacuum degree of $10^{-5}$ Pa which is considered to be sufficiently low such that the device characteristics are not adversely affected. The atmosphere of the glove box compartment 103 is kept in a nitrogen atmosphere of a dew point of $-80°$ C. and an oxygen concentration of 0.2 ppm which is considered to not influence the device characteristics.

The manufacturing procedures of each of organic electroluminescent devices of the Example and Comparative Examples 1 and 2 which are carried out by using such vacuum device 100 are hereunder described with reference to FIGS. 1 and 2 while referring other drawings as the need arises, and evaluation results thereof are then described. Incidentally, here, organic electroluminescent devices in which a structure using a transparent substrate and a transparent conductive film for both electrodes and extracting emitted light from sides of the both electrodes is used as a structure in which even when the device structure varies, efficiency for extracting emitted light does not substantially vary and which is suitable for comparison were prepared.

Example

First of all, the lower electrode 13 was formed on the substrate 11 in the following manner.

Figure 3:
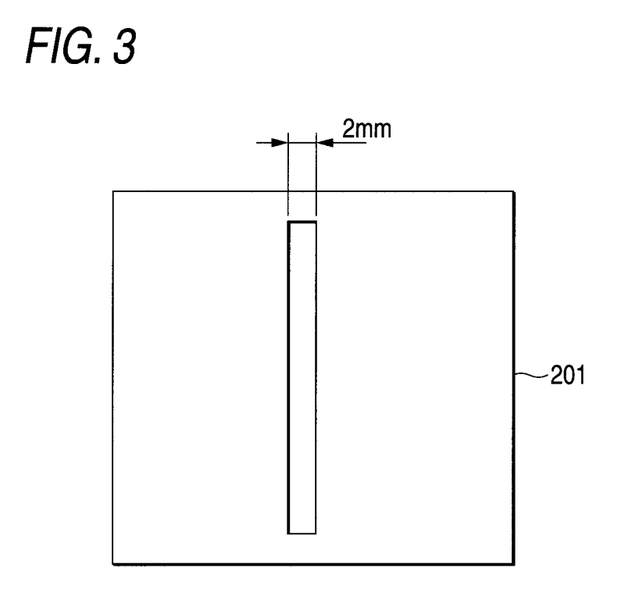
FIG. 3 is a plan view of a shadow mask which is used for the formation of a lower electrode and an upper electrode in the Examples.

The well rinsed glass substrate 11 of 25 mm in square was set up in a prescribed place of the sputtering compartment 102 from the air and evacuated to $10^{-5}$ Pa. Thereafter, IZO (manufactured by Kojundo Chemical Lab. Co., Ltd.) was formed in a thickness of 100 nm by a DC sputtering method via a shadow mask 201 provided with an aperture with a 2 mm-wide line pattern as illustrated in FIG. 3. With respect to the film formation condition, a mixed gas of Ar and $O_2$ (50/1) was used as a process gas; a vacuum degree was $10^{-5}$ Pa; a sputtering Pw was 150 W; and a film formation time was 30 minutes. There was thus obtained the lower electrode (anode) 13 made of IZO in a 2 mm-wide line pattern form.

Thereafter, the introduction of the process gas was stopped; after the vacuum degree in the sputtering compartment 102 had been recovered to $10^{-5}$ Pa, the door between the carrier compartment 104 and the sputtering compartment 102 and the door between the carrier compartment 104 and the vapor deposition compartment 101 were opened; the substrate 11 was carried from the sputtering compartment 102 into the vapor deposition compartment 101 by using the robot arm 106; and the respective doors were then closed.

Figure 4:
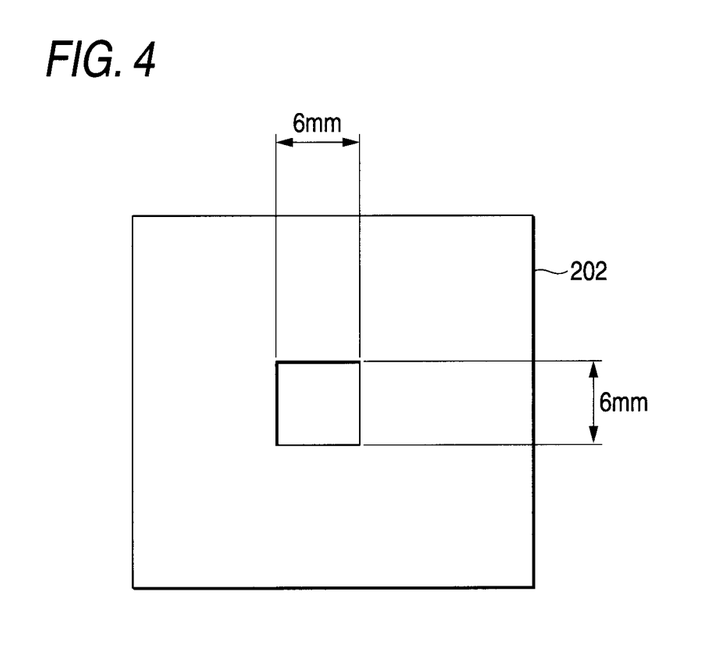
FIG. 4 is a plan view of a shadow mask which is used for the film formation of from a light emitting unit to a hole transport layer in the Examples.

Next, the film formation by vapor deposition of from the light emitting unit 15 to the hole transport layer 21 was started by film formation by vapor deposition within the vapor deposition compartment 101. On that occasion, the film formation by vapor deposition of each layer was carried out in the following manner via a shadow mask 202 provided with an aperture of 5 mm in square as illustrated in FIG. 4.

First of all, HI406 (manufactured by Idemitsu Kosan Co., Ltd.) was formed in a thickness of 50 nm as the hole injection layer 15a at a film formation rate of 0.2 nm/s.

Next, HT320 (manufactured by Idemitsu Kosan Co., Ltd.) was formed in a thickness of 50 nm as the hole transport layer 15b at a film formation rate of 0.2 nm/s.

Thereafter, BH215 (manufactured by Idemitsu Kosan Co., Ltd.) and BD142 (manufactured by Idemitsu Kosan Co., Ltd.)

were formed in a thickness of 30 nm as the organic light emitting layer 15c by double-source vapor deposition at a film formation rate of 0.2 nm/s and 0.011 nm/s, respectively.

In addition, Alq$_3$ (manufactured by Tri Chemical Laboratories Inc.) was formed in a thickness of 15 nm as the electron transport layer 15b at a film formation rate of 0.2 nm/s.

Next, LiF (manufactured by Kojundo Chemical Lab. Co., Ltd.) was formed in a thickness of 0.3 nm as a first layer of the electron injection layer 15e at a film formation rate of 0.015 nm/s. In Addition, Alq$_3$ (manufactured by Tri Chemical Laboratories Inc.) and Mg (manufactured by Kojundo Chemical Lab. Co., Ltd.) were formed in a thickness of 5 nm as a second layer of the electron injection layer 15e by double-source vapor deposition at a film formation rate of 0.1 nm/s and 0.05 nm/s, respectively.

Thereafter, LGHIL (manufactured by LG Chemical Ltd.) was formed in a thickness of 20 nm as the connection layer 17 at a film formation rate of 0.1 nm/s.

Then, HI406 (manufactured by Idemitsu Kosan Co., Ltd.) was formed in a thickness of 30 nm as a first layer of the hole transport layer 21 at a film formation rate of 0.2 nm/s. In addition, HI406 and MoO$_3$ were formed in a thickness of 5 nm as a second layer of the hole transport layer 21 by double-source vapor deposition at a film formation rate of 0.2 nm/s and 0.022 nm/s, respectively.

Thereafter, the substrate 11 was again carried into the sputtering compartment 102 to form the upper electrode (cathode) 23. On that occasion, a shadow mask having a line pattern the same as that at the film of film formation in the lower electrode 13 was arranged such that the line was orthogonal to the lower electrode 13, and IZO (manufactured by Idemitsu Kosan Co., Ltd.) was formed in a thickness of 33 nm for a film formation time of 10 minutes under the same condition as in the lower electrode 13.

There was thus prepared an organic electroluminescent device of the Example.

Comparative Example 1

The light emitting unit 15 was formed in the same procedures as in the foregoing Example. Thereafter, an organic electroluminescent device in which the upper electrode (cathode) 23 was formed directly on the light emitting unit 15 was prepared.

Comparative Example 2

The light emitting unit 15 was formed in the same procedures as in the foregoing Example. Thereafter, V$_2$O$_5$ (manufactured by Kojundo Chemical Lab. Co., Ltd.) was formed in a thickness of 20 nm as a buffer layer at a film formation rate of 0.2 nm/s. Incidentally, V$_2$O$_5$ formed as the buffer layer is also a material to be used as the connection layer 17 in the configuration according to the embodiment of the invention. Then, an organic electroluminescent device in which the upper electrode (cathode) 23 was formed directly on this buffer layer was prepared.

<Evaluation Results>

With respect to the respective organic electroluminescent devices formed in Example and Comparative Examples 1 and 2, the configuration between the light emitting unit 15 and the upper electrode (cathode) 23 is shown in the following table.

| | Connection layer 17 | Hole transport layer 21 | |
|---|---|---|---|
| | | First layer | Second layer |
| Example | LGHIL (20 nm) | HI406 (30 nm) | HI406: 20% Mo (5 nm) |
| Comparative Example 1 | — | — | — |
| Comparative Example 2 | V$_2$O$_5$ (20 nm) as buffer layer | — | — |

Each of the organic electroluminescent devices was evaluated within the glove box compartment 103. On that occasion, first of all, the treating substrate in which the organic electroluminescent device had been prepared by the film formation of the respective layers was placed in the carrier compartment 104, and the respective doors 105 were closed. Subsequently, nitrogen was introduced into the carrier compartment 104 to render it in a pressure atmosphere the same as in the glove box compartment 103; the door 105 between the carrier compartment 104 and the glove box compartment 103 was then opened; the treating substrate in which the organic electroluminescent device had been prepared was taken out into the glove box compartment 103; and the following evaluations (a) to (d) were then performed.

Figure 5:
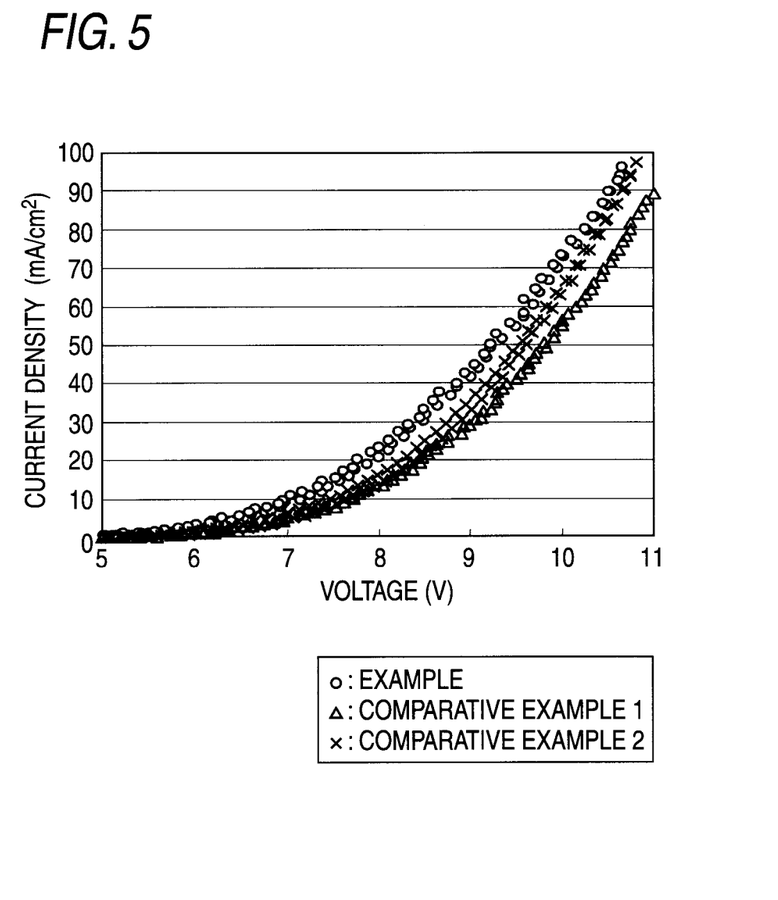
FIG. 5 is a graph to show current-voltage characteristics of each organic electroluminescent device.

(a) By turning on electricity between the lower electrode 13 and the upper electrode 23 of the organic electroluminescent device, a current was passed through a portion of 2 mm in square in which these electrodes 13 and 23 were orthogonal to each other to cause light emission. Then, current-voltage characteristics of this portion were measured. The results obtained are shown in FIG. 5. As shown in FIG. 5, the organic electroluminescent device of the Example was lower in driving voltage than the organic electroluminescent devices of Comparative Examples 1 and 2.

Figure 6:
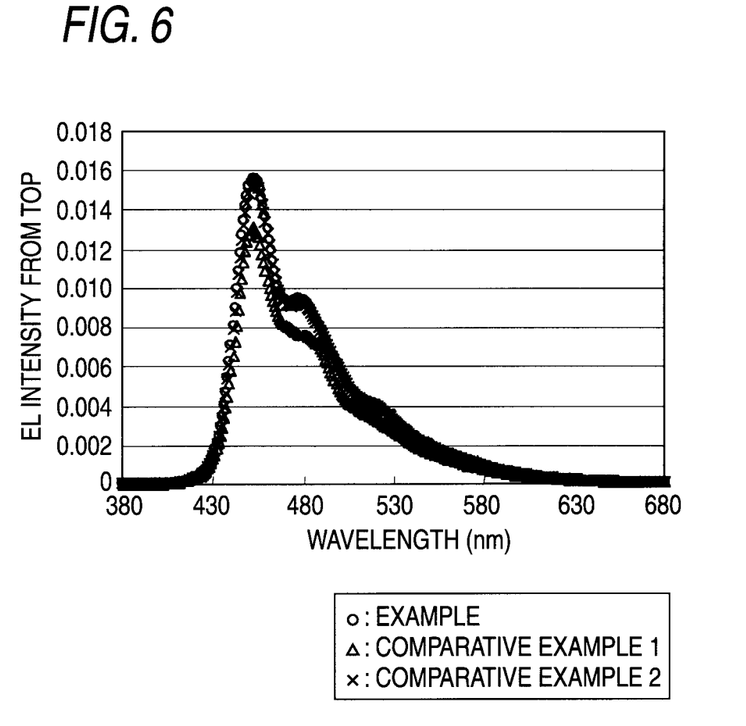
FIG. 6 is an emission spectrum of each organic electroluminescent device.

(b) Of emitted lights obtained from the both surfaces in the side of the upper electrode 23 and the side of the substrate 11, an emission spectrum obtained from the side of the upper electrode 23 at the time of application with 10 mA/cm$^2$ was measured. The results obtained are shown in FIG. 6. As shown in FIG. 6, the organic electroluminescent device of the Example was higher in intensity of the emission spectrum than the organic electroluminescent devices of Comparative Examples 1 and 2.

Figure 7:
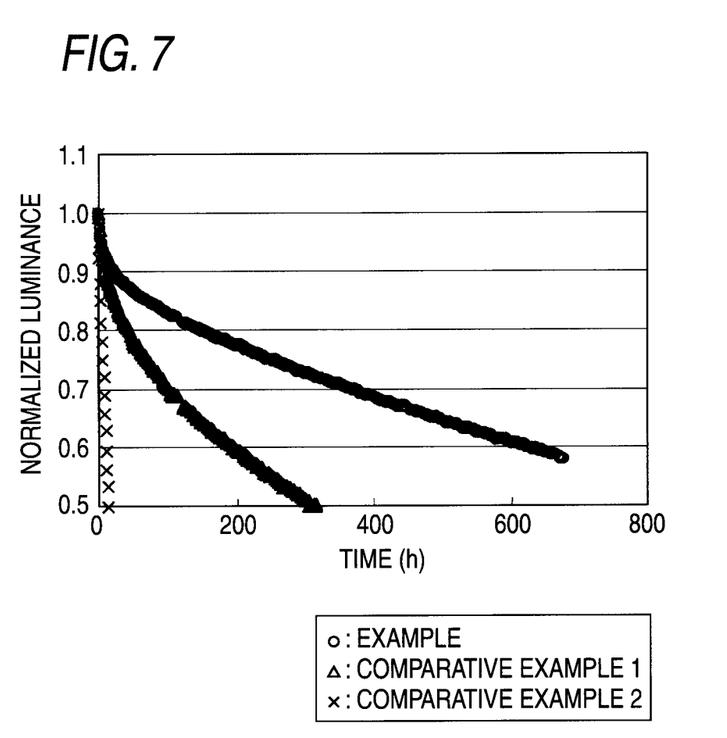
FIG. 7 is a graph to show a change of luminance with time of each organic electroluminescent device.

(c) When a pulse current of 61 mA/cm$^2$ in average with a duty of 50% was applied and an initial luminance was defined as "1", a change of luminance with time was measured. The results obtained are shown in FIG. 7. As shown in FIG. 7, the organic electroluminescent device of the Example was smaller in deterioration of luminance with time than the organic electroluminescent devices of Comparative Examples 1 and 2.

Figure 8:
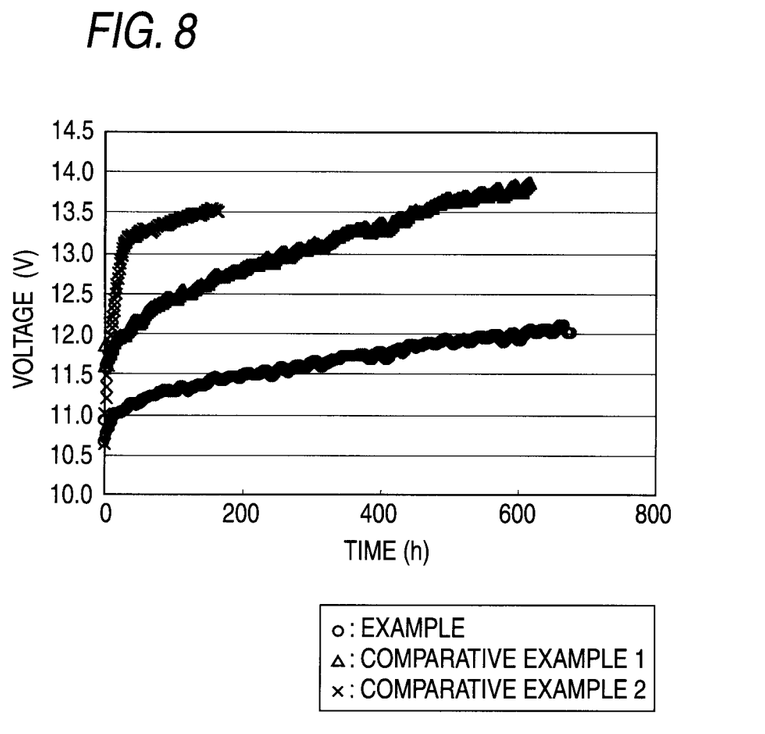
FIG. 8 is a graph to show a change of voltage with time of each organic electroluminescent device.

(d) When a pulse current of 61 mA/cm$^2$ in average with a duty of 50% was applied, a change of voltage with time was measured. The results obtained are shown in FIG. 8. As shown in FIG. 8, the organic electroluminescent device of the Example was smaller in an increase of driving voltage with time than the organic electroluminescent devices of Comparative Examples 1 and 2.

From the results of the foregoing evaluations (a) to (d), it was confirmed that by applying the embodiment according to the invention, an organic electroluminescent device which in forming the upper electrode 23, is able to prevent the light emitting unit 15 from damaging by sputtering and which is devised to improve initial characteristics and long life characteristics is obtainable.

Incidentally, Comparative Example 2 in which the buffer layer was provided between the light emitting unit 15 and the upper electrode 23 was good with respect to the initial characteristics shown in the evaluations (a) and (b) but large with respect to the deterioration with time shown in the evaluations (c) and (d) as compared with Comparative Example 1 in which the upper electrode 23 was provided directly on the light emitting unit 15. This is because it is considered that according to the configuration of Comparative Example 2, though by providing the buffer layer, the damaging by sputtering in forming the upper electrode 23 is controlled to some extent, whereby the initial characteristics are improved, the buffer layer adversely affects the life characteristics.

It should be understood by those skilled in the art that various modifications, combinations, sub-combinations and alternations may occur depending on design requirements and other factors insofar as they are within the scope of the appended claims or the equivalents thereof.

What is claimed is:

1. An organic electroluminescent device comprising:
    a substrate;
    a lower electrode on the substrate;
    a light emitting unit having at least (a) an organic light emitting layer, and (b) an electron injection layer comprising an alkali metal or an alkaline earth metal, the light emitting unit being on the lower electrode;
    a connection layer on and contacting the electron injection layer, the connection layer configured to generate an electron-hole pair;
    a charge transport layer on the connection layer;
    a charge injection layer between the connection layer and the charge transport layer; and
    a light transmissive upper electrode formed on the charge transport layer,
    wherein,
        the charge transport layer has charge transporting properties of a conducting type opposite that of against a charge to be injected from the upper electrode, and
        the connection layer and the charge transport layer are stacked in this order from a side of the light emitting unit between the light emitting unit and the upper electrode, and
        a charge generated in the connection layer and injected into a side of the light emitting unit is the same conducting type as the charge injected into the upper electrode, and
        a charge generated within the connection layer and injected into the charge injection layer is a different conduction type than the charge injected into the upper electrode.

2. The organic electroluminescent device according to claim 1, wherein the charge injection layer has charge injection properties of a conducting type the same as in the charge transport layer between the connecting layer and the charge transport layer.

3. The organic electroluminescent device according to claim 1, wherein the lower electrode is an anode, the upper electrode is a cathode, and the charge transport layer is a hole transport layer.

4. The organic electroluminescent device according to claim 1, wherein the upper electrode is configured of a transparent conductive film made of a metal oxide.

5. The organic electroluminescent device according to claim 1, wherein the charge transport layer comprises a first layer and a second layer, the first layer having a chemical composition different than that of the first layer.

6. The organic electroluminescent device according to claim 1, wherein the connection layer comprises an electron accepting material, the electron accepting material is selected from the group consisting of vanadium oxide, molybdenum oxide, tungsten oxide, ruthenium oxide, ferric chloride DDQ (dicy-ano-dichloroquinone), TNF (trinitrofluorenone) and TCNQ (tetracyanoquinodimethane).

* * * * *